US008609487B2

(12) United States Patent
Natori et al.

(10) Patent No.: US 8,609,487 B2
(45) Date of Patent: Dec. 17, 2013

(54) METHOD OF MANUFACTURING SEMICONDUCTOR DEVICE

(75) Inventors: Katsuaki Natori, Yokohama (JP);
Masayuki Tanaka, Yokohama (JP);
Akihito Yamamoto, Naka-gun (JP);
Katsuyuki Sekine, Yokohama (JP);
Ryota Fujitsuka, Yokohama (JP);
Daisuke Nishida, Yokohama (JP);
Yoshio Ozawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 405 days.

(21) Appl. No.: 12/686,005

(22) Filed: Jan. 12, 2010

(65) Prior Publication Data

US 2010/0136780 A1   Jun. 3, 2010

Related U.S. Application Data (62) Division of application No. 11/727,536, filed on Mar. 27, 2007, now Pat. No. 7,682,899.

(30) Foreign Application Priority Data

Apr. 14, 2006  (JP) .................................. 2006-112189

(51) Int. Cl.
*H01L 21/336* (2006.01)
(52) U.S. Cl.
USPC ............................ 438/257; 438/261; 438/266
(58) Field of Classification Search
USPC .......................... 438/257, 266, 261, 263, 264
See application file for complete search history.

(56) References Cited

U.S. PATENT DOCUMENTS

| 6,642,573 | B1 * | 11/2003 | Halliyal et al. ............... 257/316 |
| 7,202,128 | B1 | 4/2007 | Orimoto et al. |
| 2003/0042558 | A1 | 3/2003 | Noguchi et al. |
| 2005/0118838 | A1 | 6/2005 | Tanaka |

FOREIGN PATENT DOCUMENTS

| JP | 64-50428 A | 2/1989 |
| JP | 3-217059 A | 9/1991 |
| JP | 5-129625 | 5/1993 |
| JP | 5-267567 A | 10/1993 |
| JP | 06-013545 A | 1/1994 |

(Continued)

OTHER PUBLICATIONS

"Final Notice of Rejection," mailed Aug. 30, 2011, from the Japanese Patent Office in counterpart Japanese Patent Application No. 2006-112189, along with English translation thereof (5 pages).

(Continued)

*Primary Examiner* — Jack Chen
(74) *Attorney, Agent, or Firm* — Finnegan, Henderson, Farabow, Garrett & Dunner, LLP (57) ABSTRACT

A method of manufacturing a semiconductor device comprising a first insulating film formed on a semiconductor substrate, a charge storage layer formed on the first insulating film, a second insulating film formed on the charge storage layer, and a control electrode formed on the second insulating film, wherein forming the second insulating film comprises forming an insulating film containing silicon using source gas not containing chlorine, and forming an insulating film containing oxygen and a metal element on the insulating film containing silicon.

7 Claims, 5 Drawing Sheets

(56) References Cited

FOREIGN PATENT DOCUMENTS

| JP | 08-045925 A | 2/1996 |
| JP | 2003-197785 A | 7/2003 |
| JP | 2004-103688 A | 4/2004 |
| JP | 2005-277223 A | 10/2005 |
| JP | 2005-311300 A | 11/2005 |
| JP | 2006-5006 A | 1/2006 |
| JP | 2007-305966 A | 11/2007 |
| KR | 2003-0019259 A | 3/2003 |

OTHER PUBLICATIONS

Notification for Filing Opinion mailed Sep. 10, 2008, from the Korean Patent Office in corresponding Korean Application No. 10-2007-36541 and English translation thereof.

Notice of Reasons for Rejection mailed on Jun. 14, 2011, from the Japanese Patent Office in Japanese Patent Application No. 2006-112189, and English translation thereof.

* cited by examiner

METHOD OF MANUFACTURING SEMICONDUCTOR DEVICE

CROSS-REFERENCE TO RELATED APPLICATIONS

This application is a divisional of U.S. application Ser. No. 11/727,536, filed Mar. 27, 2007, and is based upon and claims the benefit of priority from prior Japanese Patent Application No. 2006-112189, filed Apr. 14, 2006, the entire contents of both of which are incorporated herein by reference.

BACKGROUND OF THE INVENTION

1. Field of the Invention

The present invention relates to a method of manufacturing a semiconductor device.

2. Description of the Related Art

In recent years, nonvolatile semiconductor memory devices have been proposed in which a high-dielectric-constant insulating film containing oxygen and a metal element is provided between a control electrode and a charge storage layer in order to increase the capacitance between the control electrode and the charge storage layer (see, for example, Jpn. Pat. Appln. KOKAI Publication No. 5-129625). A silicon oxide film or a silicon nitride film may be provided over or under the high-dielectric-constant insulating film.

However, a method for forming the silicon oxide film and silicon nitride film has not been sufficiently examined. It has thus been difficult to obtain nonvolatile semiconductor memory device that are excellent in characteristics and reliability.

BRIEF SUMMARY OF THE INVENTION

A first aspect of the present invention provides a method of manufacturing a semiconductor device comprising a first insulating film formed on a semiconductor substrate, a charge storage layer formed on the first insulating film, a second insulating film formed on the charge storage layer, and a control electrode formed on the second insulating film, wherein forming the second insulating film comprises: forming an insulating film containing silicon using source gas not containing chlorine; and forming an insulating film containing oxygen and a metal element on the insulating film containing silicon.

A second aspect of the present invention provides a method of manufacturing a semiconductor device comprising a first insulating film formed on a semiconductor substrate, a charge storage layer formed on the first insulating film, a second insulating film formed on the charge storage layer, and a control electrode formed on the second insulating film, wherein forming the second insulating film comprises: forming an insulating film containing oxygen and a metal element; and forming an insulating film containing silicon on the insulating film containing oxygen and the metal element using source gas not containing chlorine.

DETAILED DESCRIPTION OF THE INVENTION

An embodiment of the present invention will be described below with reference to the drawings.

Figure 6:
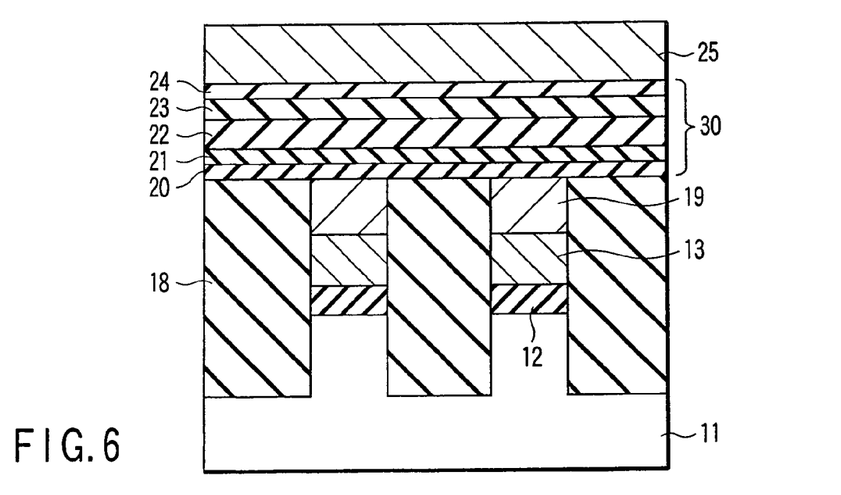
FIG. 6 is a sectional view schematically showing a part of the process of manufacturing a semiconductor device according to the embodiment of the present invention.
Figure 7:
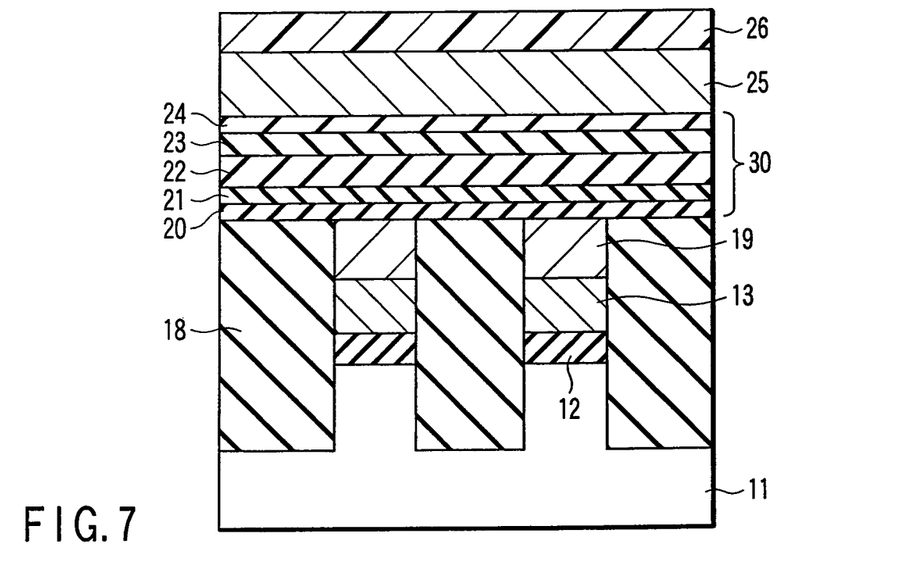
FIG. 7 is a sectional view schematically showing a part of the process of manufacturing a semiconductor device according to the embodiment of the present invention.
Figure 8:
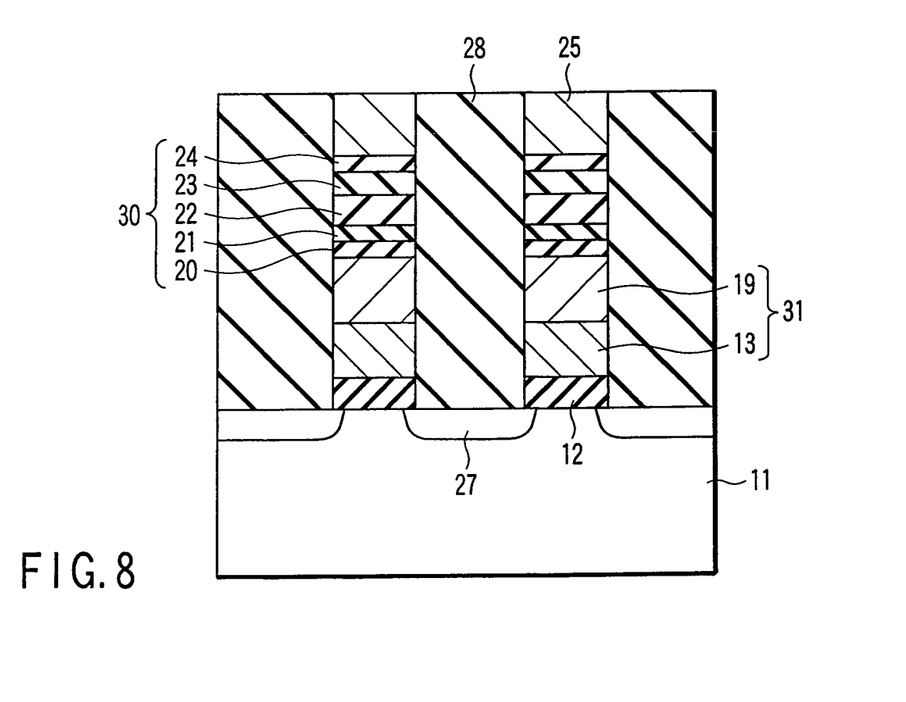
FIG. 8 is a sectional view schematically showing a part of the process of manufacturing a semiconductor device according to the embodiment of the present invention.

FIGS. 1 to 8 are sectional views schematically showing a process of manufacturing a semiconductor device (nonvolatile semiconductor memory device) according to an embodiment of the present invention. FIGS. 1 to 7 are sectional views in a word line direction. FIG. 8 is a sectional view in a bit line direction. With reference to FIGS. 1 to 8, description will be given below of the method for manufacturing a semiconductor device according to the present embodiment.

Figure 1:
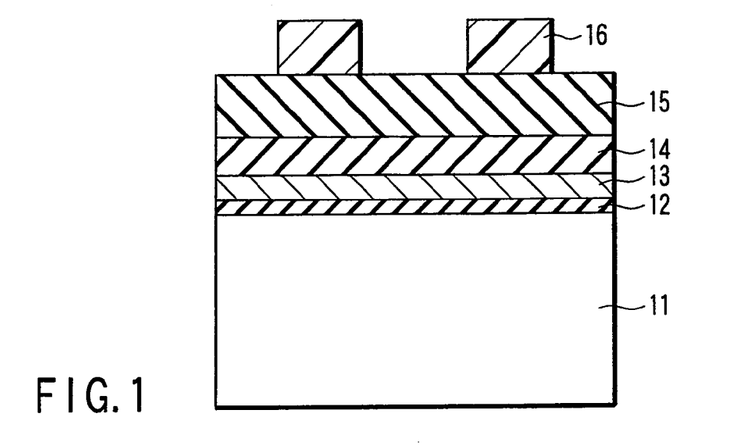
FIG. 1 is a sectional view schematically showing a part of a process of manufacturing a semiconductor device according to an embodiment of the present invention.

First, as shown in FIG. 1, a tunnel insulating film (first insulating film) 12 is formed on a p-type silicon substrate (semiconductor substrate) 11 to a thickness of about 1 to 15 nm. An n-type silicon substrate with a p-type well may be used as the semiconductor substrate 11. A polysilicon film 13, which is a part of a floating gate electrode film, is formed on the tunnel insulating film 12 to a thickness of about 10 to 200 nm by a CVD (Chemical Vapor Deposition) process. Subsequently, the CVD process is used to form a silicon nitride film 14 to a thickness of about 50 to 200 nm and then a silicon oxide film 15 to a thickness of about 50 to 400 nm. Further, photo resist is coated on the silicon oxide film 15 and patterned to form a resist mask 16.

Figure 2:
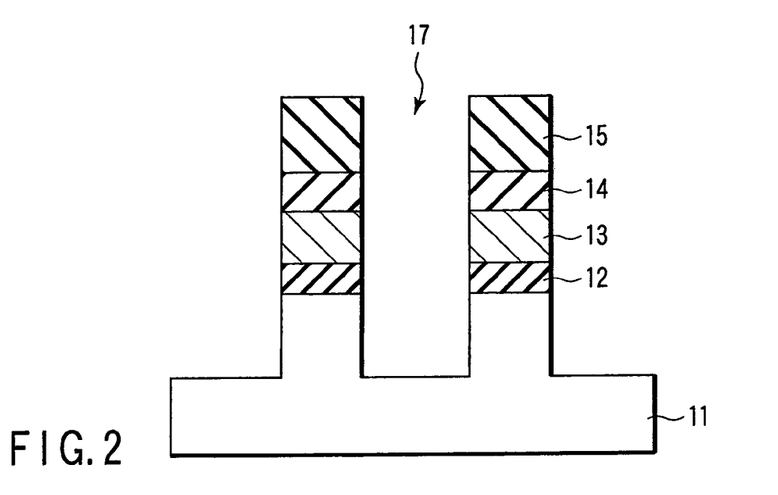
FIG. 2 is a sectional view schematically showing a part of the process of manufacturing a semiconductor device according to the embodiment of the present invention.

Then, as shown in FIG. 2, the resist mask 16 is used as a mask to selectively etch the silicon oxide film 15. The resist mask 16 is removed. The silicon oxide film 15 is subsequently used as a mask to etch the silicon nitride film 14, polysilicon film 13, tunnel insulating film 12, and silicon substrate 11. This results in the formation of an isolation trench 17. To eliminate damage to sides of the isolation trench, a high-temperature oxidation treatment is executed.

The present embodiment uses a stack film of the silicon nitride film 14 and silicon oxide film 15 as a mask to form the isolation trench 17. However, setting appropriate conditions for film thickness and reactive ion etching allows the use of a single layer of a silicon nitride film or a single layer of a silicon oxide film.

Figure 3:
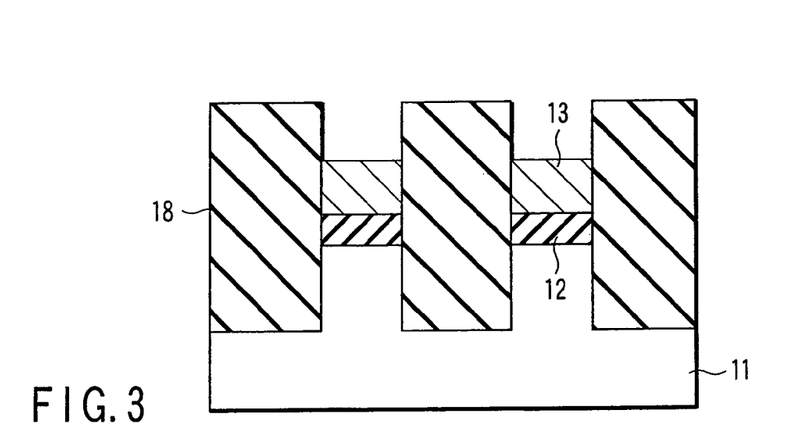
FIG. 3 is a sectional view schematically showing a part of the process of manufacturing a semiconductor device according to the embodiment of the present invention.

Then, as shown in FIG. 3, a silicon oxide film is formed all over the surface to a thickness of 200 to 1,500 nm as an isolation insulating film 18, which buries the isolation trench 17. Further, a high-temperature treatment is executed in a nitrogen or oxygen atmosphere to densify the isolation insulating film 18. A flattening process is subsequently executed by CMP (Chemical Mechanical Polishing) using the silicon nitride film 14 as a CMP stopper. Further, the silicon nitride film 14 is removed using hot phosphorus acid.

Figure 4:
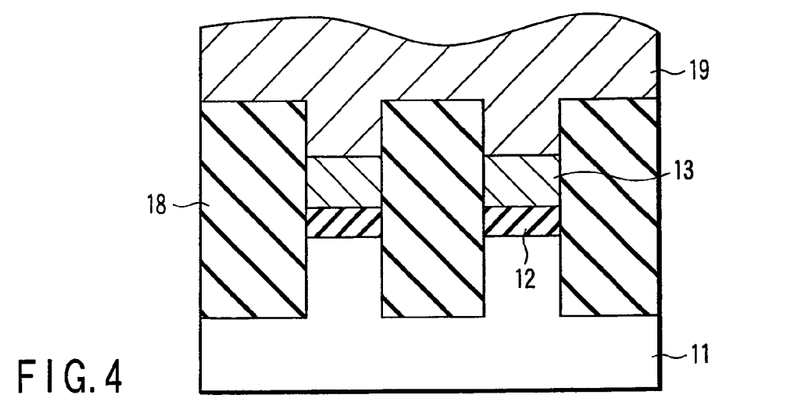
FIG. 4 is a sectional view schematically showing a part of the process of manufacturing a semiconductor device according to the embodiment of the present invention.

Then, as shown in FIG. 4, a method that is excellent in step coverage is used to deposit a polysilicon film 19 constituting a part of the floating gate electrode film, in the trench and on the isolation insulating film 18, which result from the removal of the silicon nitride film 14.

Figure 5:
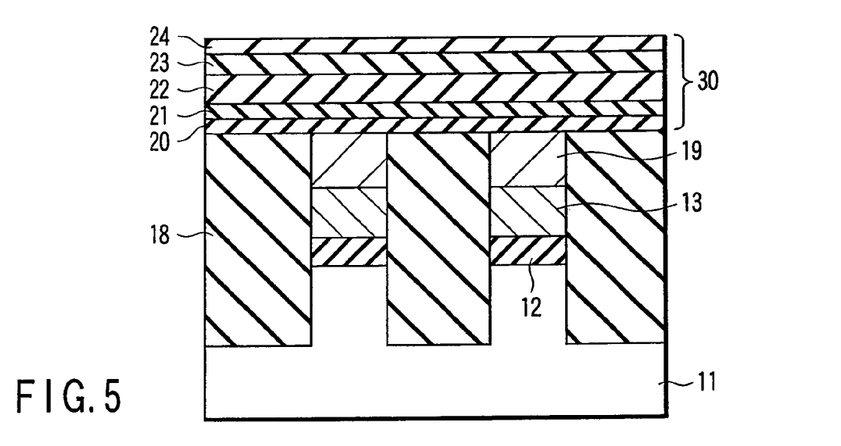
FIG. 5 is a sectional view schematically showing a part of the process of manufacturing a semiconductor device according to the embodiment of the present invention.

Then, as shown in FIG. 5, the polysilicon film 19 is flattened by the CVP process using the isolation insulating film 18 as a stopper.

A stack film of a silicon nitride film 20, a silicon oxide film 21, a high-dielectric-constant insulating film 22, a silicon oxide film 23, and a silicon nitride film 24 is then formed on the isolation insulating film 18 and the polysilicon film 19 as an inter-electrode insulating film (second insulating film) 30. The high-dielectric-constant insulating film 22 contains oxygen and a metal element. The high-dielectric-constant insulating film 22 has a relative dielectric constant higher than that (about 3.8 to 4.0) of the silicon oxide film ($SiO_2$ film). In particular, the insulating film desirably has a relative dielectric constant higher than that (about 5.0 to 5.5) of an ONO film previously widely used as an inter-electrode insulating film. The present embodiment uses a hafnium aluminum oxide film (HfAlO film) as the high-dielectric-constant insulating film 22.

A detailed description will be given below of a method for forming an inter-electrode insulating film.

First, $N_2$ plasma is used to nitridize the surface of the polysilicon film 19 to form a silicon nitride film 20 of thickness 2 nm. Deposition temperature is set at 300° C. and plasma power is set at 800 W.

Then, a silicon oxide film 21 is deposited on the silicon nitride film 20 using source gas not containing chlorine. Specifically, a silicon oxide film 21 of thickness 3 nm is deposited by a plasma CVD process using $SiH_4$ and $N_2O$ as source gas. Deposition temperature is set at 450° C., pressure is set at 5 Torr, and plasma power is set at 1 kW. The flow rates of $SiH_4$ and $N_2O$ are set at 300 sccm and 2 SLM, respectively.

Then, an HfAlO film is deposited on the silicon oxide film 21 to a thickness of 10 nm as the high-dielectric-constant insulating film 22. Specifically, a wafer is held in a vacuum chamber with its pressure set at 0.5 Torr. The temperature of the wafer is set at 300° C. A source material for Al is, for example, TMA (trimethyl aluminum). A source material for Hf is, for example, TEMAH (tetrakis-ethyl-methyl-amino-hafnium). An oxidizer is, for example, ozone ($O_3$). The thickness of the high-dielectric-constant insulating film 22 may be appropriately selected from the range of 1 to 30 nm. Description will be given of a specific sequence of deposition of the HfAlO film 22.

To form an HfAlO film, it is possible to stack an HfO layer and an AlO layer on each other or to form a mixture of Hf and Al, which is then oxidized. Description will be given of the method of stacking an HfO layer and an AlO layer on each other. Hf source gas is allowed to flow to form an Hf adsorption layer. The oxidizer (for example, $O_3$) is then allowed to flow to form an HfO layer. An HfO layer is formed a required number of times. Further, Al source gas is allowed to flow to form an Al adsorption layer. The oxidizer (for example, $O_3$) is then allowed to flow to form an AlO layer. An AlO layer is formed a required number of times. Then, an HfO layer is formed again as required. The thickness and composition of the HfAlO film can be controlled by appropriately varying the number and order of stacked layers.

In the present example, the formation of a stack film of nine HfO layers and one AlO layer is repeated ten times. This forms HfAlO with Hf:Al=8:1 and a film thickness of 10 nm. The flow rate of TMA is set at 20 sccm, and the flow rate of TEMAH is 100 sccm. The flow rate of $O_3$ is 5 SLM, and the concentration of $O_3$ is 250 g/m$^3$. The time for which the source gas is supplied is 1 second for TMA and TEMAH and 3 seconds for $O_3$. Furthermore, between the supply of TMA and $O_3$ and between the supply of TEMAH and $O_3$, $N_2$ is allowed to flow at a flow rate of 5 slm for 2 seconds for purging.

After the deposition of the high-dielectric-constant insulating film 22, annealing is carried out (post-deposition anneal: PDA) in an atmosphere containing an oxidizer such as oxygen, ozone, or steam (water vapor). Anneal temperature is set between 500 and 1,200° C. Annealing time is about 10 minutes to 2 hours for furnace annealing or 1 second to 30 minutes for lamp annealing. The annealing process densifies the high-dielectric-constant insulating film 22 and improves film quality.

Then, source gas not containing chlorine is used to deposit a silicon oxide film 23 of thickness 3 nm on the high-dielectric-constant insulating film 22. Deposition conditions for the silicon oxide film 23 are the same as those for the silicon oxide film 21.

Then, source gas not containing chlorine is used to deposit a silicon nitride film 24 of thickness 2 nm on the silicon oxide film 23. Specifically, BTBAS (bis-tertialy-buthyl-amino-silane) and ammonia ($NH_3$) are used as a source material. Pressure is set at 1 Torr, and deposition temperature is set at 400° C. The flow rates of BTBAS and $NH_3$ are set at 500 sccm and 1.5 slm, respectively.

Thus, an inter-electrode insulating film 30 is obtained which is formed of the stack film of the silicon nitride film 20, silicon oxide film 21, high-dielectric-constant insulating film 22, silicon oxide film 23, and silicon nitride film 24.

Then, as shown in FIG. 6, a polysilicon film 25 is formed on the inter-electrode insulating film 30 to a thickness of 10 to 200 nm as a control gate electrode film.

Then, as shown in FIG. 7, photo resist 26 is coated on the polysilicon film 25 and patterned to form a resist mask 26. The resist mask 26 has patterns perpendicular to patterns of the resist mask 16 (see FIG. 1).

Then, as shown in FIG. 8 (sectional view taken along the bit line direction), the resist mask 16 is used as a mask to etch the polysilicon film, inter-electrode insulating film 30, polysilicon film 19, polysilicon film 13, and tunnel insulating film 12. This results in a floating gate electrode (charge storage layer) 31 formed of the polysilicon films 13 and 19 and a control gate electrode (control electrode) formed of the polysilicon film 25. The resultant gate structure is used as a mask to dope n-type impurities into the silicon substrate. Further, a thermal treatment is executed to activate the n-type impurities to form a source/drain area 27. Moreover, the formation of an inter-layer insulating film 28 and the like are executed.

The resultant nonvolatile semiconductor memory device comprises a tunnel insulating film (first insulating film; electric capacitance C1) 12 formed on a silicon substrate (semiconductor substrate) 11, a floating gate electrode (charge storage layer) 31 formed on the tunnel insulating film 12, an inter-electrode insulating film (second insulating film; electric capacitance C2) 30 formed on the floating gate electrode 31, a control gate electrode (control electrode) 25 formed on the inter-electrode insulating film 30, and a source/drain area 27 that sandwiches the channel area under the floating gate electrode 31.

In each of the memory cells in the resultant nonvolatile semiconductor memory device, applying a high voltage between the silicon substrate 11 and the control gate electrode 25 allows an electric field corresponding to a coupling ratio (C2/C1+C2)) to be applied to the tunnel insulating film 12. A tunnel current thus flows through the tunnel insulating film 12. This changes the amount of charge stored in the floating gate electrode 31. As a result, the threshold voltage of the memory cell changes to perform a data write or erase operation.

In an actual nonvolatile semiconductor memory device, a plurality of memory cells are arranged in the word line direction and in the bit line direction. A typical example of the above nonvolatile semiconductor memory device is a NAND type nonvolatile memory in which a plurality of memory cells connected together in series are provided between select transistors.

In the above embodiment, the bottom surface and top surface of the high-dielectric-constant insulating film 22 are in contact with the silicon oxide films 21 and 23, respectively, which have been formed using the source gas not containing chlorine. However, the bottom surface and top surface of the high-dielectric-constant insulating film 22 may be in contact with silicon nitride films formed using source gas not containing chlorine. In other words, the high-dielectric-constant insulating film 22 may be formed directly on a lower silicon nitride film formed using source gas not containing chlorine. An upper silicon nitride film may be formed directly on the high-dielectric-constant film 22 using source gas not containing chlorine. Further, a silicon-containing insulating film (insulating film formed using source gas not containing chlorine) such as a silicon oxide film or a silicon nitride film may not be formed on both bottom surface and top surface of the high-dielectric-constant insulating film 22 but has only to be formed in contact with at least one of the surfaces.

The deposition temperature of the silicon-containing insulating film (insulating film formed using source gas not containing chlorine) is desirably at most 500° C.

Description will be given below of effects of a manufacturing method according to the present embodiment.

Figure 9:
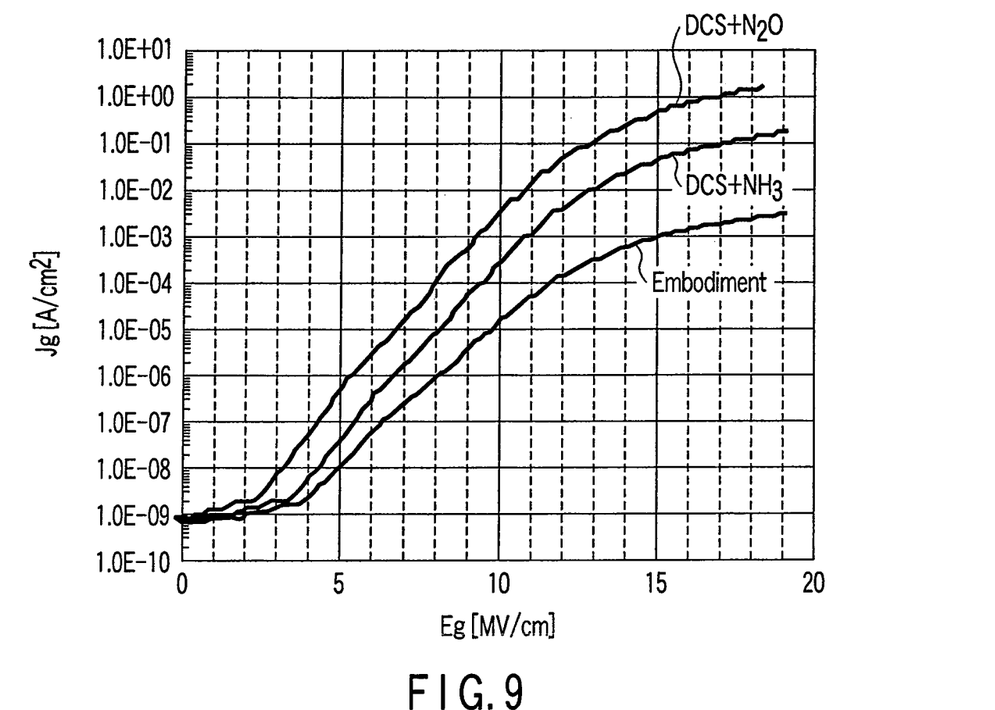
FIG. 9 is a diagram showing the effects of the embodiment of the present invention exerted if an inter-electrode insulating film is formed in accordance with the manufacturing method of the embodiment.

FIG. 9 shows an I-V characteristic observed if an inter-electrode insulating film 30 is formed in accordance with the manufacturing method of the present embodiment and I-V characteristics observed if inter-electrode insulating films 30 are formed in accordance with manufacturing methods in comparative examples. In the first comparative example, silicon oxide films 21 and 23 were formed by the CVD process using DCS (dichlorosilane) and $N_2O$ as a source material. The silicon oxide films 21 and 23 had a thickness of 3 nm. Formation temperature was set at 750° C. In the second comparative example, a silicon nitride film 24 was formed by an LPCVD process using DCS and $NH_3$ as a source material. The formation temperature of the silicon nitride film was set at 500° C. The process except for the formation process of the silicon oxide film or the silicon nitride film was the same.

As shown in FIG. 9, the manufacturing method of the present embodiment enables a reduction in leakage current compared to the manufacturing methods in the comparative examples. Now, explanation will be given of the reason for the reduction in leakage current.

The high-dielectric-constant insulating film containing oxygen and a metal element has its insulating property significantly degraded by an oxygen defect. Chlorine (Cl) bonds readily to metal elements. Accordingly, upon entering the high-dielectric-constant insulating film, chlorine bonds readily to the metal element. This cuts the bond between the metal element and oxygen, leading to an oxygen defect. The resultant oxygen defect forms a leakage current path, which may degrade the insulating property of the high-dielectric-constant insulating film. In particular, if the high-dielectric-constant insulating film is formed of a plurality of crystal grains, a degradation reaction is likely to occur at crystal grain boundaries.

If a silicon oxide film (or silicon nitride film) is formed using source gas containing chlorine under the high-dielectric-constant insulating film, chlorine remaining in the film diffuses in the high-dielectric-constant insulating film during the thermal treatment in the formation of the high-dielectric-constant insulating film or during the thermal treatment following the formation. This results in an oxygen defect. If a silicon oxide film (or silicon nitride film) is formed using source gas containing chlorine over the high-dielectric-constant insulating film, chlorine also diffuses in the high-dielectric-constant insulating film during the deposition process. This results in an oxygen defect.

When a silicon oxide film is formed over the high-dielectric-constant insulating film at a high temperature, the high-dielectric-constant insulating film may be degraded. Thus, in this case, the silicon oxide film needs to be formed at a low temperature, which reduces a density of the silicon oxide film. When a silicon nitride film is formed on such a less dense silicon oxide film using source gas containing chlorine such as DCS, the silicon oxide film cannot prevent the diffusion of chlorine. As a result, during the formation of a silicon nitride film, chlorine diffuses in the high-dielectric-constant insulating film, leading to an oxygen defect.

The present embodiment forms a silicon oxide film or a silicon nitride film using source gas not containing chlorine. This makes it possible to prevent a possible oxygen defect attributed to chlorine and thus the possible degradation of insulating property of the high-dielectric-constant insulating film. Consequently, the present embodiment enables a reduction in the leakage current from the high-dielectric-constant insulating film. This makes it possible to manufacture nonvolatile semiconductor memory devices that are excellent in characteristics and reliability. In particular, if the high-dielectric-constant insulating film is formed of a plurality of crystal grains, the method of the present embodiment is very effective because a degradation reaction is likely to occur at crystal grain boundaries.

The effectiveness of the method of the present embodiment will be described in further detail. The bond between the metal element (for example, HF) and oxygen is weaker than that between silicon and oxygen or between silicon and nitrogen. Further, as already described, chlorine bonds readily to the metal element. That is, substitution between oxygen and chlorine in the high-dielectric-constant insulating film containing oxygen and the metal element is much more likely to occur than substitution between oxygen and chlorine or nitrogen and chlorine in the silicon oxide film or silicon nitride film. The ONO film (silicon oxide film/silicon nitride film/silicon oxide film), previously widely used as an inter-electrode insulating film, contains no metal element, which bonds readily to chlorine. Thus, the ONO film does not pose the oxygen defect problem caused by chlorine. In contrast, if the inter-electrode insulating film contains a high-dielectric-constant insulating film, the oxygen defect attributed to chlorine is a serious problem. Therefore, the method of the present embodiment exerts very good effects that cannot be obtained with the conventional method if the inter-electrode insulating film contains the high-dielectric-constant insulating film and if a silicon oxide film or a silicon nitride film is formed over or under the high-dielectric-constant insulating film.

The embodiment of the present invention has been described. However, many variations may be made to the present embodiment.

Figure 10:
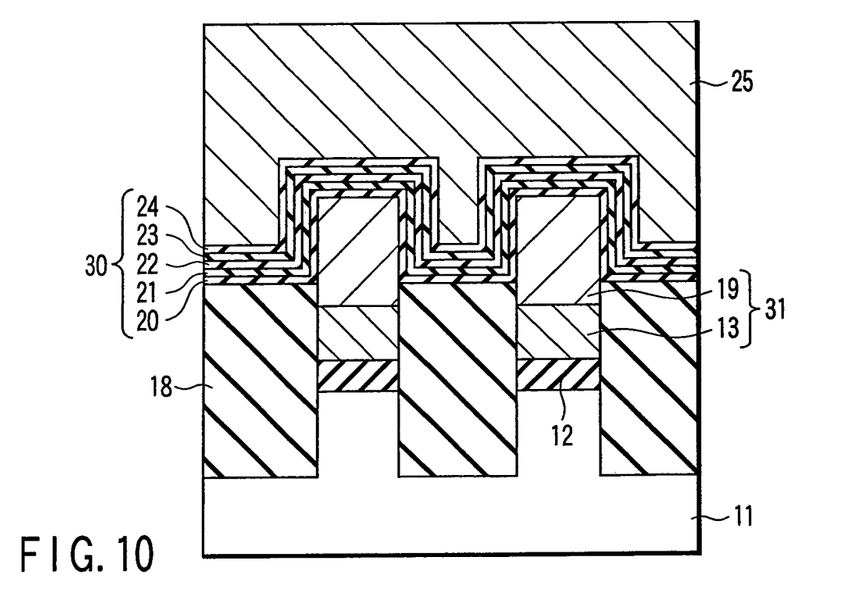
FIG. 10 is a sectional view schematically showing the configuration of a semiconductor device according to a modification of the embodiment of the present invention.

FIG. 10 is a sectional view schematically showing the configuration of a semiconductor device (nonvolatile semiconductor memory device) according to a modification of the present embodiment, in the word line direction. Components in FIG. 10 corresponding to those shown in FIGS. 1 to 8 are denoted by the same reference numerals. Their detailed description is omitted. In the example shown in FIG. 10, an inter-electrode insulating film 30 is formed along the top surface and sides of a floating gate electrode 31. This memory cell structure also makes it possible to provide advantages and effects similar to those of the embodiment shown in FIGS. 1 to 8.

The above embodiment uses the HfAlO film as the high-dielectric-constant insulating film 22. However, the high-dielectric-constant insulating film 22 may be an aluminum oxide ($Al_2O_3$) film having a relative dielectric constant of about 8. It is also possible to use a magnesium oxide (MgO) film having a relative dielectric constant of about 10 or an yttrium oxide ($Y_2O_3$) film having a relative dielectric constant of about 16. A hafnium oxide ($HfO_2$) film or zirconium oxide ($ZrO_2$) film may also be used which has a relative dielectric constant of about 22. It is also possible to use a tantalum oxide ($Ta_2O_5$) film, a bismuth oxide ($Bi_2O_3$) film, a strontium oxide (SrO) film, or a lanthanum oxide ($La_2O_3$) film which have a relative dielectric constant of about 25. In particular, a high-dielectric-constant insulating film 22 is desirably used which contains at least one of Hf and Al. An insulating film formed of a metal silicate such as a hafnium silicate (HfSiO) may also be used. The high-dielectric-constant insulating film may contain nitrogen. A stack film of a plurality of high-dielectric-constant insulating films may also be used.

The above embodiment may use $SiH_4$, $Si_2H_6$, $SiBr_4$, $SiI_4$, or $SiF_4$ as the silicon source material contained in the source gas used to form a silicon oxide film by CVD. It is also possible to use an alkoxide represented by $Si(OR1)_4$ (R1 is a linear or branched alkyl group having one, two or three carbon atoms), or an alkoxide represented by $R2_xSi(OR3)_y$ (R2 is a linear or branched alkyl group having one, two or three carbon atoms, a phenyl group, or a cyclopentadienyl group, R3 is a linear or branched alkyl group having one, two or three carbon atoms, and x and y are positive integers). These alkoxides may be, for example, $Si(OC_2H_5)_4$, $(C_2H_5)Si(OC_2H_5)_3$, $C_6H_5Si(OC_2H_5)_3$, or $(CH_3)_2Si(OC_2H_3)_2$.

It is also possible to use an amino compound represented by $Si_x(NR4R5)_yH_z$ (R4 and R5 are linear or branched alkyl groups having one, two or three carbon atoms, x and y are positive integers, and z is 0 or a positive integer). This amino compound may be, for example, an organic silicon compound such as $HMDS((CH_3)_3SiNHSi(CH_3)_3)$ or TDMAS $(C_8H_{24}N_4Si)$. The oxygen source material (oxidizer) may be $N_2O$, $O_2$, NO, $NO_2$, $CO_2+H_2$, $H_2O$, or $O_3$.

The above embodiment may use $SiH_4$, $Si_2H_6$, $SiBr_4$, $SiI_4$, $SiF_4$, or $C_8H_{22}N_2Si$ as the silicon source material contained in the source gas used to form a silicon nitride film by CVD. It is also possible to use an amino compound represented by $Si_x(NR4R5)_yH_z$ (R4 and R5 are linear or branched alkyl groups having one, two or three carbon atoms, x and y are positive integers, and z is 0 or a positive integer). This amino compound may be, for example, an organic silicon compound such as $BTBAS(C_8H_{22}N_2Si)$, $HMDS((CH_3)_3SiNHSi(CH_3)_3)$, or $TDMAS(C_8H_{24}N_4Si)$. The nitrogen source material (nitridizer) may be $NH_3$, $N_2H_4$, or $N_2$.

For example, if $SiH_4$ and $N_2O$ are used as a CVD source material for a silicon oxide film and $SiH_4$ and $NH_3$ are used as a CVD source material for a silicon nitride film, $N_2O$ and $NH_3$ can be switched in forming a stack film of the silicon oxide film and silicon nitride film. This improves productivity.

In the nonvolatile memory described above in the embodiment, the inter-electrode insulating film 30 is provided between the floating gate electrode (charge storage layer) 31 and the control gate electrode 25. However, the method of the above embodiment is also applicable to a nonvolatile memory of what is called a MONOS structure in which a charge block insulating film is provided between the charge storage layer and the control gate electrode.

Figure 11:
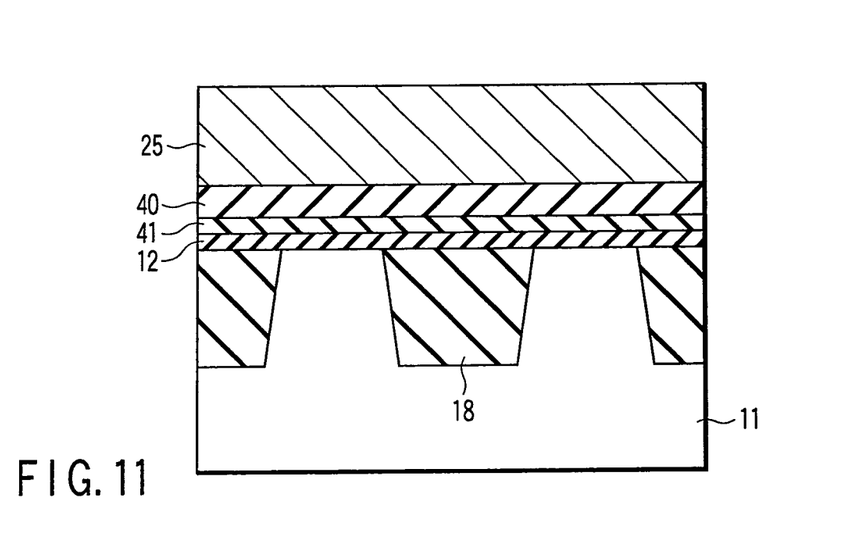
FIG. 11 is a sectional view schematically showing the configuration of a semiconductor device according to another modification of the embodiment of the present invention.

FIG. 11 is a sectional view schematically showing the configuration of a nonvolatile memory of the MONOS structure. The basic configuration of this memory is similar to that shown in the above embodiment. Components of this memory corresponding to those shown in the above embodiment are denoted by the same reference numerals. Their detailed description is omitted.

As shown in FIG. 11, the nonvolatile memory cell of the MONOS structure comprises the silicon substrate (semiconductor substrate) 11 on which the following are sequentially stacked: the tunnel insulating film (first insulating film) 12, a charge storage layer 41 formed of a silicon nitride film, a charge block insulating film (second insulating film) 40, and the control gate electrode (control electrode) 25. It is also possible to apply a formation method similar to that for the inter-electrode insulating film 30 shown in the above embodiment, to the charge block insulating film 40.

Thus, with the nonvolatile memory of the MONOS structure, effects similar to those shown in the above embodiment can be exerted by application of a method similar to that shown in the above embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising a first insulating film formed on a semiconductor substrate, an insulating layer formed on the first insulating film, a second insulating film formed on the insulating layer, and a control electrode formed on the second insulating film, wherein forming the second insulating film comprises:

forming a third insulating film formed of $SiO_2$ on the insulating layer, the third insulating film being formed by a CVD process using source gas not containing chlorine, and the third insulating film being in contact with an upper surface of the insulating layer; and forming a fourth insulating film containing oxygen and a metal element on the third insulating film.

2. The method according to claim 1, wherein
a silicon source material contained in the source gas for the third insulating film is selected from $SiH_4$, $Si_2H_6$, $SiBr_4$, $SiI_4$, $SiF_4$, an alkoxide represented by $Si(OR1)_4$ (R1 is a linear or branched alkyl group having one to three carbon atoms), an alkoxide represented by $R2_xSi(OR3)_y$ (R2 is a linear or branched alkyl group having one to three carbon atoms, a phenyl group, or a cyclopentadienyl group, R3 is a linear or branched alkyl group having one to three carbon atoms, and x and y are positive integers), and an amino compound represented by $Si_x(NR4R5)_yH_z$ (R4 and R5 are linear or branched alkyl groups each having one to three carbon atoms, x and y are positive integers, and z is 0 or a positive integer).

3. The method according to claim 2, wherein an oxygen source material contained in the source gas for the third insulating film is selected from $N_2O$, $O_2$, NO, $NO_2$, $CO_2+H_2$, $H_2O$, and $O_3$.

4. The method according to claim 1, wherein the fourth insulating film contains at least one of hafnium (Hf), aluminum (Al), zirconium (Zr), magnesium (Mg), yttrium (Y), tantalum (Ta), bismuth (Bi), strontium (Sr), and lanthanum (La).

5. The method according to claim 1, wherein the fourth insulating film is formed of a plurality of crystal grains.

6. The method according to claim 1, further comprising forming a fifth insulating film containing silicon and oxygen on the fourth insulating film by a CVD process using source gas not containing chlorine.

7. The method according to claim 6, wherein the fifth insulating film is formed of $SiO_2$.

\* \* \* \* \*